(12) United States Patent
Schimmel

(10) Patent No.: US 8,310,241 B2
(45) Date of Patent: Nov. 13, 2012

(54) BATTERY SENSOR UNIT

(75) Inventor: Ralf Schimmel, Weilmuenster (DE)

(73) Assignee: Continental Automotive GmbH, Hannover (DE)

( * ) Notice: Subject to any disclaimer, the term of this patent is extended or adjusted under 35 U.S.C. 154(b) by 720 days.

(21) Appl. No.: 12/443,630

(22) PCT Filed: Sep. 26, 2007

(86) PCT No.: PCT/EP2007/060181
§ 371 (c)(1),
(2), (4) Date: Mar. 30, 2009

(87) PCT Pub. No.: WO2008/037724
PCT Pub. Date: Apr. 3, 2008

(65) Prior Publication Data
US 2009/0243622 A1    Oct. 1, 2009

(30) Foreign Application Priority Data
Sep. 28, 2006 (DE) .......................... 10 2006 046 137

(51) Int. Cl.
*G01N 27/416* (2006.01)
*H02J 7/14* (2006.01)

(52) U.S. Cl. ........ 324/437; 324/426; 320/104; 320/105; 439/754; 439/758; 439/760

(58) Field of Classification Search .................... 324/437
See application file for complete search history.

(56) References Cited

U.S. PATENT DOCUMENTS

| | | | |
|---|---|---|---|
| 4,901,902 A * | 2/1990 | Stapleton | 224/326 |
| 5,052,663 A | 10/1991 | Clinch et al. | |
| 7,381,101 B2 * | 6/2008 | Roset et al. | 439/754 |
| 7,405,570 B2 | 7/2008 | Hirthammer | |
| 2003/0057770 A1* | 3/2003 | Heim | 307/9.1 |
| 2005/0176282 A1* | 8/2005 | Hirthammer | 439/217 |
| 2006/0264276 A1* | 11/2006 | Nye et al. | 473/481 |

FOREIGN PATENT DOCUMENTS

| | | |
|---|---|---|
| DE | 39 37 339 A1 | 5/1990 |
| DE | 102004006298 A1 | 9/2005 |
| DE | 102004033127 B3 | 4/2006 |
| DE | 102004055848 A1 | 5/2006 |
| DE | 102004055847 A1 | 6/2006 |

* cited by examiner

*Primary Examiner* — Edward Tso
*Assistant Examiner* — Johali Torres Ruiz
(74) *Attorney, Agent, or Firm* — Cozen O'Connor

(57) ABSTRACT

A battery sensor unit including a pole terminal, the terminal being electrically conductively connected to a plate-shaped carrier element and a planar measuring shunt, the shunt including a resistor element and adjoining resistor connections on both sides thereof. The carrier element is connected in an electrically conducting manner to the one resistor connection, and the second free end region of the carrier element is connected electrically insulated to the second resistor connection. A spacer made of an electrically insulating material is provided. The second free end region of the carrier element and the second resistor connection with the sides facing each other are connected to the spacer. Said spacer can be connected with the second free end region of the carrier element and also with the second resistor connection.

16 Claims, 3 Drawing Sheets

BATTERY SENSOR UNIT

PRIORITY CLAIM

This is a U.S. national stage of application No. PCT/EP2007/060181, filed on 26 Sep. 2007, which claims priority to the German Application No. 10 2006 046 137.1, filed: 28 Sep. 2006; the contents of both being incorporated here by reference.

BACKGROUND OF THE INVENTION

1. Field of the Invention

The invention generally relates to a battery sensor unit having a fastening device, in particular a pole terminal, configured to be connected to a pole of a motor vehicle battery and is electrically conductively connected to a plate-like carrier element having a planar measuring shunt which extends parallel to the carrier element at a distance from the latter and comprises a resistance element and resistance connections which adjoin both sides of the latter, one free end region of the carrier element being cohesively and electrically conductively connected to one resistance connection and the second free end region of the carrier element being connected to the second resistance connection in an electrically insulated manner. A spacer made of an electrically insulating material is arranged between the second free end region of the carrier element and the second resistance connection, the sides of the second free end region of the carrier element and of the second resistance connection which face one another abutting said spacer, said spacer being able to be connected both to the second free end region of the carrier element and to the second resistance connection, and the spacer being able to be connected to the second free end region of the carrier element and/or to the second resistance connection by a releasable connection.

2. Description of Prior Art

In the case of such a battery sensor unit, it is known to fasten the second free end region of the carrier element to the second resistance connection using a screw, insulating means having to be provided in all contact regions between the screw and the carrier element and between the carrier element and the second resistance connection.

This construction not only requires a multiplicity of components but is also complicated to assemble.

DE 10 2004 055 847 A1 discloses a battery sensor unit. In this case, the second free end region of the carrier element is connected to the resistance connection by a screw. In the region of the screw connection, insulating means are arranged in all contact zones between the resistance connection and the carrier element and between the screw and the carrier element.

SUMMARY OF THE INVENTION

Therefore, an object of the invention is to provide a battery sensor unit that requires only a few components, which has a simple construction, and can be assembled in a simple and rapid manner.

According to one embodiment of the invention, the spacer is connected to a second free end region of the carrier element and/or to the second resistance connection by a latching connection.

According to one embodiment of the invention, a spacer made of an electrically insulating material is arranged between the second free end region of the carrier element and the second resistance connection, those sides of the second free end region of the carrier element and of the second resistance connection which face one another abutting said spacer, and said spacer being able to be connected both to the second free end region of the carrier element and to the second resistance connection.

Preferably the measuring shunt and the carrier element are positioned exactly with respect to one another and can be cohesively connected to one another at one of their ends. In this case, the spacer is used as an assembly aid.

Following cohesive connection, the measuring shunt and the carrier element are maintained in their desired position with respect to one another by the spacer so that the cohesive joint is relieved of mechanical loading and cannot break.

The measuring shunt and the carrier element are easily connected to one another in a mechanically stable manner at two points which are at a distance from one another.

The spacer can be easily mounted on the measuring shunt and the carrier element without the need for tools.

Preferably, the spacer is connected to the second free end region of the carrier element and/or to the second resistance connection of a releasable connection.

The spacer is easily mounted on the measuring shunt and the carrier element without tools if the spacer is connected to the second free end region of the carrier element and/or to the second resistance connection by a latching connection.

Preferably, the spacer has one or more spring arms that extend from the carrier element and the second resistance connection transversely with respect to the longitudinal extent, one end of said spring arms being permanently arranged on the spacer, and said spring arms having, on their other free end, a latching hook which engages around an edge region of the carrier element or the second resistance connection.

To produce a symmetrical and thus particularly stable connection, a pair of aligned spring arms having latching hooks which face one another can engage around the longitudinal sides of the carrier element and/or the second resistance connection so as to hold said element and/or connection between said spring arms in the manner of tongs.

In one embodiment, the free ends of a pair of aligned spring arms project through a recess in the carrier element and/or in the second resistance connection, and for latching hooks of said spring arms, which face away from one another, to engage around the carrier element and/or the second resistance connection at the edge of the recess.

In one embodiment, the spacer is approximately H-shaped design. The carrier element and the second resistance connection are supported on a side of the crossbeam of the "H", and the arms of the "H" which each extend to a side of the crossbeam forming a pair of spring arms, the latching hooks of one pair of spring arms being in the opposite direction to the latching hooks of the other pair of spring arms.

In one embodiment, one pair of spring arms engages around from the outside and the other pair of spring arms projects through the recess and engages around the edges thereof from the inside.

The spring arms of one pair of spring arms are preferably at a shorter distance from one another than those of the other pair of spring arms.

The crossbeam of the "H" is preferably in the form of a bending beam and it is possible to compensate for tolerance-induced differences in the length of the spring arms.

It is possible to dispense with preassembly of the spacer if the spacer is in one piece.

The spacer can be produced in a particularly cost-effective manner if the spacer is a plastic injection-molded part.

The first resistance connection can be connected to a ground connection or to a load.

The measuring shunt and the carrier element are cohesively connected in a particularly advantageous manner if the carrier element is cohesively connected to the first resistance connection by means of brazing, in particular by means of resistance brazing, or by means of welding, in particular by means of resistance welding, with the result that a specific current reliably flows from the carrier element to the measuring shunt via the cohesive connection.

The resistance connections may have connecting elements for conductive connection to an electronic evaluation unit.

BRIEF DESCRIPTION OF THE DRAWINGS

Exemplary embodiments of the invention are illustrated in the drawing and are described in more detail below. In the drawing

DETAILED DESCRIPTION OF THE PRESENTLY PREFERRED EMBODIMENTS

Figure 1:
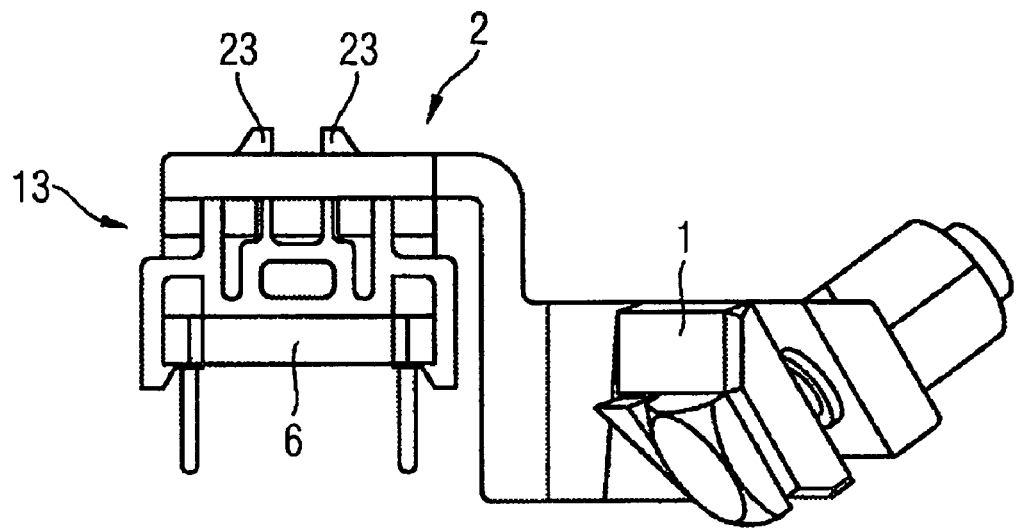
FIG. 1 is a view of a battery sensor unit.
Figure 2:
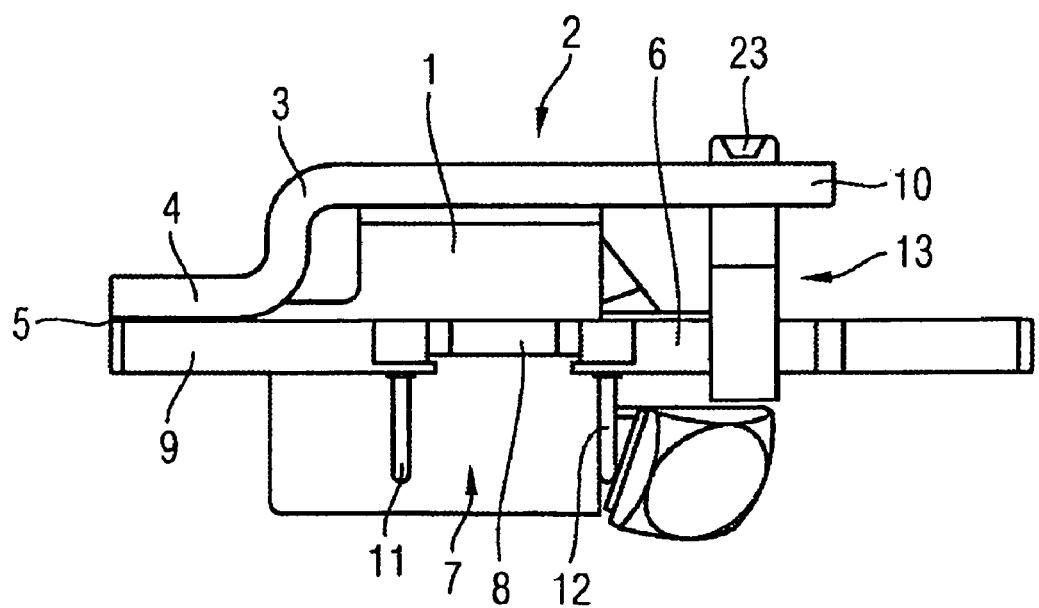
FIG. 2 is a side view of the battery sensor unit according to FIG. 1.
Figure 3:
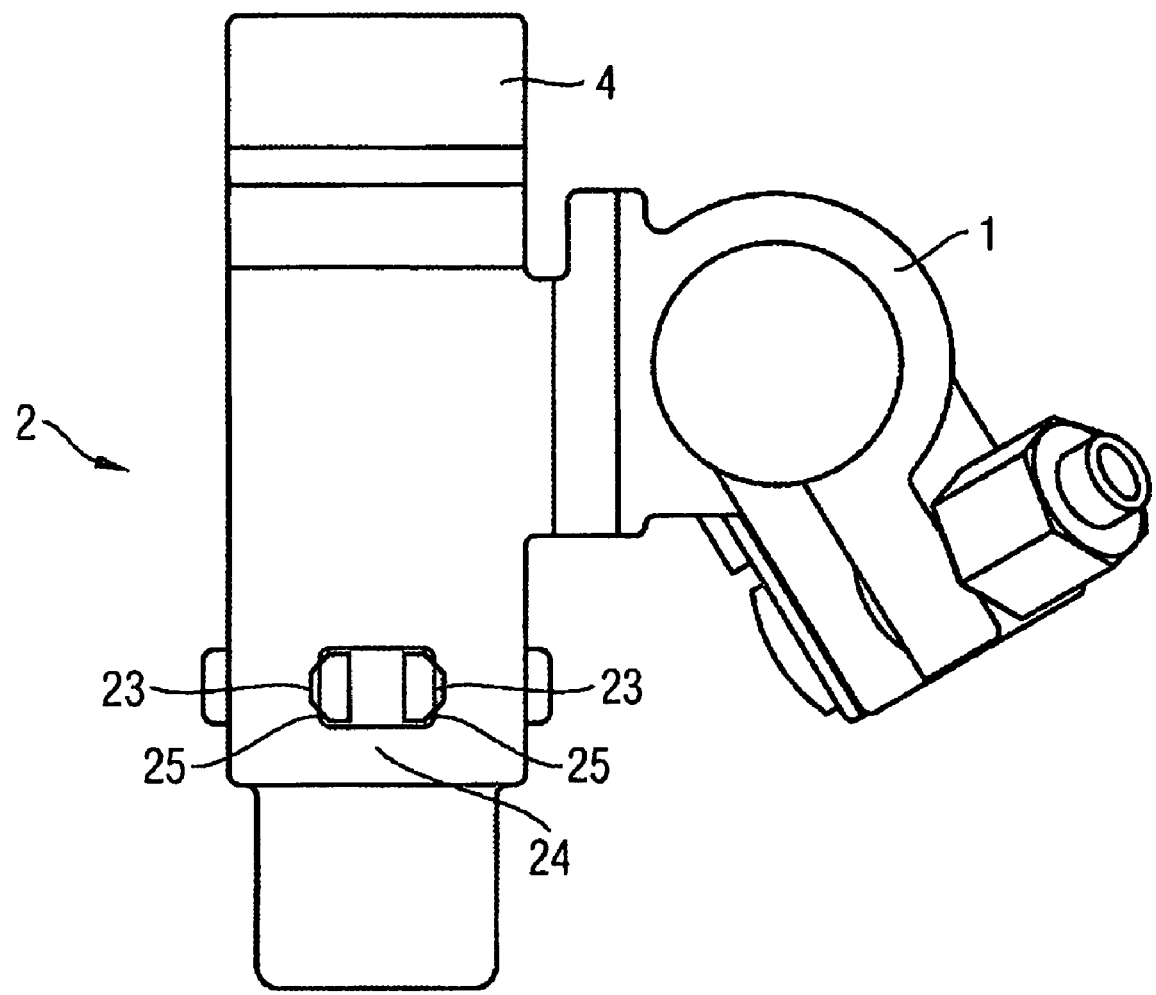
FIG. 3 is a plan view of the battery sensor unit according to FIG. 1.

The battery sensor unit illustrated in the drawing has a pole terminal 1 which is composed of an electrically conductive material, configured to be fastened to a negative pole of a motor vehicle battery and is preferably formed in one piece with a longitudinally extending plate-like carrier element 2. The pole terminal 1 and the carrier element 2 are preferably brass or a brass alloy.

At one end region, the carrier element 2 has a stepped portion 3, such that region of the carrier element 2 which are on both sides of the stepped portion 3 extend in planes which are parallel to one another.

The shorter of the two regions of the carrier element forms a first end region 4 that is cohesively connected to a second resistance connection 6 of a longitudinally extending planar measuring shunt 7 by means of resistance brazing 5.

The measuring shunt 7 comprises a resistance element 8 and, on the opposite sides, a first resistance connection 9 and the second resistance connection 6 which adjoin said resistance element and is preferably copper or a copper alloy.

The resistance element 8 and the first resistance connection 9 extend parallel to the carrier element 2, at a particular distance from the latter.

The free end of the first resistance connection 9 is configured to project beyond the second end region 10 of the carrier element 2, which is opposite the first end region 4, and can be connected to a ground connection or to a load.

A first connecting element 11 is arranged on the first resistance connection 9 and a second connecting element 12 is arranged on the second resistance connection 6, said connecting elements being able to be conductively connected to an electronic evaluation unit (not illustrated).

In the region in which the second end region 10 of the carrier element 2 and the second resistance connection 6 are opposite one another, the second end region 10 and the second resistance connection 6 are both connected to one another and are supported such that they maintain the particular distance between them by means of a spacer 13 in the form of a plastic injection-molded part.

Figure 4:
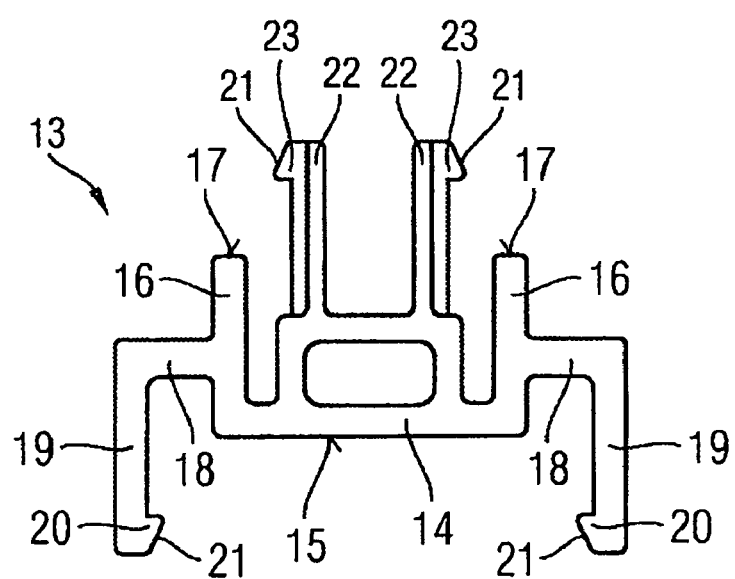
FIG. 4 is a view of a spacer of the battery sensor unit according to FIG. 1.
Figure 5:
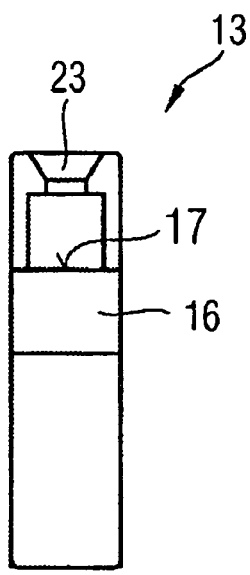
FIG. 5 is a side view of the spacer according to FIG. 4.
Figure 6:
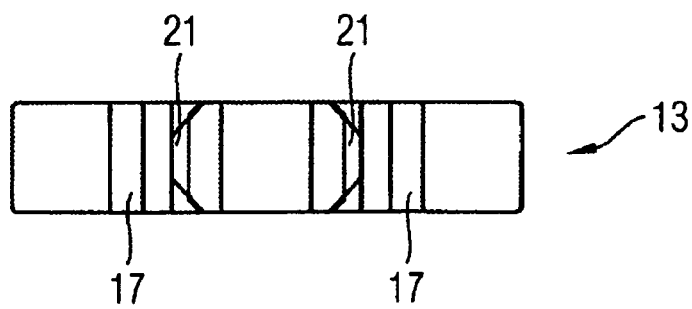
FIG. 6 is a plan view of the spacer according to FIG. 4.

The spacer 13 illustrated in more detail in FIGS. 4 to 6 is of approximately "H"-shaped design.

On its underside, the crossbeam 14 of the "H" has a bearing surface 15 which is used to place said crossbeam on the second resistance connection 6 in a transverse manner.

To easily latch over the second resistance connection 6, the first latches 20 have ramp-like bevels 21. Latches 20 are spaced apart by beams 18.

Each pair of second spring arms 22 extends between the supporting beams 16 in the opposite direction to the first spring arms 19, second latching hooks 23 having bevels 21 which are in the opposite direction to the first latching hooks 20 likewise being formed on the free ends of said second spring arms.

A continuous recess 24 with a rectangular cross section is formed in the second end region 10 of the carrier element 2.

The second spring arms 22 project through the recess 24, the second latching hooks 23 resiliently engaging around those edges 25 of the recess 24 which are opposite one another. Surface 17 of support beam 16 is configured to seat on carrier 2.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A battery sensor unit comprising:
a fastening device configured to mate with a particular pole terminal of a motor vehicle battery;
a plate-like carrier element electrically conductively connected to the fastening device;
a planar measuring shunt that extends substantially parallel to the plate-like carrier element spaced apart from the plate-like carrier element, the planar measuring shunt comprising:
a resistance element having a first and a second side; and
first and second resistance connection that adjoin the first and second sides of the resistance element respectively;
a first free end region of the plate-like carrier element being cohesively and electrically conductively connected to the first resistance connection;
a second free end region of the plate-like carrier element being connected to the second resistance connection in an electrically insulated manner,
an electrically insulating spacer arranged between the second free end region of the plate-like carrier element and the second resistance connection, the electrically insulating spacer abutting a side of the second free end region of the plate-like carrier element and a side of the second resistance connection that face one another; and at least one releasable connection configured to releasably connect the electrically insulating spacer to at least one of the second free end region of the plate-like carrier element and the second resistance connection, wherein the at least one releasable connection is a latching connection.

2. The battery sensor unit according to claim 1, wherein the electrically insulating spacer comprises:

a first spring arm extending substantially perpendicularly with respect to a longitudinal extent of the plate-like carrier; and at least one latching hook on a free other end of the first spring arm, wherein the latching hook is configured to engage at least one of an edge region of the plate-like carrier element and the second resistance connection.

3. The battery sensor unit according to claim 1, further comprising a pair of the spring arms each of the spring arms having latching hooks which face one another configured to engage and hold in a tong-like manner at least one of longitudinal sides of the plate-like carrier element and the second resistance connection.

4. The battery sensor unit according to claim 2, wherein the first resistance connection is connected to one of a ground connection or a load.

5. The battery sensor unit according to claim 2, wherein the plate-like carrier element is cohesively connected to the first resistance connection of brazing.

6. The battery sensor unit according to claim 2, wherein the resistance connections have connecting elements for conductive connection.

7. The battery sensor unit according to claim 2, wherein the plate-like carrier element is cohesively connected to the first resistance connection by welding.

8. The battery sensor unit according to claim 3, wherein the free ends of the pair of spring arms project through a recess in at least one of the plate-like carrier element and the resistance connection, wherein the latching hooks of the spring arms engage one of the plate-like carrier element and the resistance connection at the edge of the recess.

9. The battery sensor unit according to claim 3, wherein the electrically insulating spacer is of approximately H-shaped design having a crossbeam and arms, the plate-like carrier element and the second resistance connection each being supported on opposite sides of the crossbeam the H-shaped design, and the arms of the H that each extend from a side of the crossbeam forming the pairs of spring arms, the latching hooks of one pair of spring arms being in an opposite direction to the latching hooks of the other pair of spring arms.

10. The battery sensor unit according to claim 9, wherein the spring arms of one pair of spring arms are at a shorter distance from one another than those of the other pair of spring arms.

11. The battery sensor unit according to claim 9, wherein the crossbeam is configured as a bending beam.

12. The battery sensor unit according to claim 9, wherein the electrically insulating spacer only a single piece.

13. The battery sensor unit according to claim 12, wherein the electrically insulating spacer is a plastic injection-molded part.

14. The battery sensor unit according to claim 9, wherein the electrically insulating spacer further comprises at least one support beam that extends substantially perpendicularly from the crossbeam, a spacing between the plate-like carrier element and the second resistance connection based at least in part on a length of the support beam.

15. The battery sensor unit according to claim 14, wherein the electrically insulating spacer further comprises a pair of support beams, extending substantially perpendicularly from the cross member, substantially parallel to one of the first and second pair of spring arms.

16. The battery sensor unit according to claim 9, wherein the electrically insulating spacer comprises:

a cross member extending transverse to a longitudinal extent of the plate-like carrier;

a first pair of first spring arms extending in a first direction substantially perpendicularly from the cross member, each of the first pair of spring arms having a first latching hook at a free end of the spring arm opposite the cross member; and a second pair of first spring arms extending in a second direction, opposite the first direction, substantially perpendicularly from the cross member, each of the second pair of spring arms having a second latching hook at a free end of the spring arm opposite the cross member.

* * * * *